US006664848B1

(12) United States Patent
Gist

(10) Patent No.: US 6,664,848 B1
(45) Date of Patent: Dec. 16, 2003

(54) ON-CHIP POWER SUPPLY NOISE REDUCTION

(75) Inventor: William B. Gist, Chelmsford, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/180,794

(22) Filed: Jun. 26, 2002

(51) Int. Cl.[7] .................................... H03B 1/00
(52) U.S. Cl. .................................... 327/551
(58) Field of Search .................... 327/540, 541, 327/545, 546, 551, 552, 558, 559

(56) References Cited

U.S. PATENT DOCUMENTS 5,877,930 A 3/1999 Gist .................... 361/111
5,986,868 A 11/1999 Gist .................... 361/111
6,028,417 A 2/2000 Ang et al. .................... 323/209
6,069,521 A 5/2000 Taylor et al. .................... 327/540
6,184,746 B1 * 2/2001 Crowley .................... 327/551
6,472,929 B2 * 10/2002 Kobayashi et al. .................... 327/540

* cited by examiner

*Primary Examiner*—Jeffrey Zweizig
(74) *Attorney, Agent, or Firm*—Lahive & Cockfield, LLP

(57) ABSTRACT

An apparatus and method are provided for damping a noise component of a power signal from a power source. The apparatus and method are able to produce a load current in phase with the noise component to lower an effective impedance of a circuit driven by the power source to damp the noise component. The apparatus and method are able to produce the load current in phase with the noise component between a first cutoff frequency and a second cutoff frequency. The first cutoff frequency is determined in part by a time constant and the second cutoff frequency is determined in part by the physical properties of the materials that form the apparatus.

23 Claims, 4 Drawing Sheets

ON-CHIP POWER SUPPLY NOISE REDUCTION

TECHNICAL FIELD OF THE INVENTION

The present invention generally relates to power systems for an integrated circuit and more particularly, to the reduction of noise on a bus of the power system supplying power to the integrated circuit.

BACKGROUND OF THE INVENTION

A load current supplied by a power source external to an integrated circuit varies with the workload of the integrated circuit. The variability in the load current supplied by the external power source to the integrated circuit results in a voltage noise component on an output signal of the power source. The integrated circuit includes a power grid that may include positive nodes, negative nodes, input nodes and output nodes. The noisy output signal is passed onto the power grid of the integrated circuit. The voltage noise component is due in part to the flow of the load current through inductances between the external power source and nodes of the power grid of the integrated circuit. As a result, a variable load current flows from a positive power grid node in the integrated circuit to a negative power grid node in the integrated circuit or from a negative power grid node of the integrated circuit to a positive power grid node of the integrated circuit and through an output signal node of the integrated circuit. Consequently, timing in the integrated circuit can be skewed and the reliability of the integrated circuit is possibly reduced due to voltage excursions on the power grid caused by the voltage noise component of the output signal from the external power source.

One conventional approach to reducing the variability of the load current is to increase an amount of on-chip charge storage capability either by adding decoupling capacitors or by increasing the size of the decoupling capacitors. A further step that is commonly taken in conjunction with increasing the amount of on-chip charge storage capability is to minimize integrated circuit packaging inductance and printed wiring board (PWB) inductance. One example of reducing the packaging inductance and the PWB inductance is the use of a ball grid array (BGA) package. Unfortunately this approach has a significant cost impact due to the additional on-chip decoupling capacitors and the specialized manufacturing processes and tools needed to manufacture PWB's and BGA packages.

Another known approach is to increase the passive series resistance value or reduce the passive parallel resistance value of the power bus of the integrated circuit. The thus changed passive resistance value further damps the resonant circuit formed by the stored charge of on-chip capacitance, the leads and the packaging of the integrated circuit, and the interconnections between the integrated circuit and the power source external to the integrated circuit. The term "damping" refers to a lowered "Q" or "quality factor" for the described resonant circuit. However, the change in the passive resistance results in a substantial increase in the amount of power dissipated by the integrated circuit and a loss of operating voltage magnitude.

Still another approach to reduce power bus noise voltage on a power bus of an integrated circuit caused by variability in a load current of the integrated circuit is AC damping. AC damping typically employs a circuit having a resistor in series with a capacitor for the purpose of reducing noise associated with a power source. The capacitance value of the capacitor must be a large fraction of the total on-chip capacitance of the integrated circuit, which, unfortunately, limits the availability of on-chip charge storage through a frequency response limiting resistance. Consequently, on-chip charge storage is not directly available from the on-chip storage capacitors at high noise frequencies values. The high noise frequency values are frequency values at or above the clock frequency of the integrated circuit. As a result, chip performance suffers due to an increase in switching time of the gates of the integrated circuit.

Another conventional approach to overcoming the problems associated with load current variability is the clamping of a power supply voltage to a nominal value plus a threshold value. This approach reduces the amount of voltage stress placed on the power bus or power grid of the integrated circuit in instances where the chip packaging and the PWB interconnect inductance have a relatively high value. This approach is less effective where the chip packaging and the PWB interconnection inductances have a modest inductance value. The reason for this is that the modest inductance value prevents the clamping of the power supply.

A further known approach generates a signal with a current value at about 180 degrees out of phase with the power supply noise voltage to null the noise component of the power signal. This approach is limited to about the resonant frequency of the on-chip power supply grid and has little effect in reducing power supply noise voltage at frequencies above the resonant frequency of the power grid. Unfortunately, power supply voltage noise often exceeds the resonant frequency of the power supply grid. Consequently, noise frequencies above the resonant frequency of the integrated circuit power grid go uncompensated.

Another approach to reducing a power supply noise voltage component creates an actively generated damping resistance with an upper frequency response limit that is determined by the device technology used to implement the actively generated damping resistance. Typically, the actively generated damping resistance devices are not responsive to power supply voltage noise frequencies at or above the clock frequency of the integrated circuit. As a consequence, the actively generated damping resistance provides no noise voltage reduction at or above the clock frequency of the integrated circuit.

SUMMARY OF THE INVENTION

The present invention addresses the above described limitations of reducing a noise voltage component from a power source external to, or off-chip from, an integrated circuit. In accordance with one aspect of the present invention, a noise voltage component from a power source coupled to an integrated circuit is offset between a first frequency cutoff value and a second frequency cutoff value to reduce a noise voltage amplitude on a power grid of the integrated circuit.

In one embodiment of the present invention, a circuit for reducing a noise component of a power signal on a power grid in an integrated circuit is provided. The circuit is configured as a damping circuit capable of providing a first current component at an output of the damping circuit when the noise component of the power signal is below a first cutoff frequency. The damping circuit is capable of providing a second current component at the output node of the damping circuit when the noise component of the power signal is at or above the first cutoff frequency. The second current component provided by the damping circuit flows in phase with the frequency of the noise component to reduce the noise component of the power signal on the power grid of the integrated circuit.

The ability to provide the second current component in phase with the noise component of the power signal, allows the circuit to provide a substantially linear resistance that is capable of damping the noise component without a substantial voltage drop commonly associated with parallel or series damping resistance. Consequently, the damping circuit lowers an effective impedance value for the power grid of the integrated circuit when a frequency value of the noise component reaches the first cutoff frequency. The damping circuit provides the effective impedance value at or above the first cutoff frequency up to a second cutoff frequency value limited by the inductance and capacitance associated with on-die electrical conductor physical layout.

In accordance with another embodiment of the present invention, a method is provided for offsetting a noise component of a power supply output signal received by an integrated circuit. The method includes the steps of producing a first current signal in a circuit coupled to the power supply output signal when the noise component of the power supply output signal is below a selected frequency value. The method also includes the step for producing a second current signal in the circuit coupled to the power supply output signal when the noise component of the power supply output signal is at or above the selected frequency value. The second current signal flows in phase with the noise component of the power supply output signal up to a cutoff frequency. The method allows the integrated circuit to lower an effective impedance for the power supply when a frequency value of the noise component reaches the selected frequency.

The lower effective impedance is provided by a portion of a voltage to current converter that operates as a substantially resistive load to damp the noise component of the power signal from the power source between about the selected frequency value and about the cutoff frequency value that is determined by the on-die inductor and capacitor attributes of the integrated circuit. Generally, the cutoff frequency can be up to about 10 times the clock frequency of the integrated circuit.

In still another embodiment of the present invention, a circuit is provided that is capable of providing a substantially resistive load to damp a noise component of a power signal from a power source external to the, circuit. The circuit includes a biased voltage generator that generates a biased voltage representative of a voltage value between a first power source node and a second power source node. A voltage to current converter is coupled to the biased voltage generator through a resonant circuit. The voltage to current converter is responsive to the biased voltage generated by the biased voltage generator to produce a current flow between the first power source node and the second power source node of the circuit. The voltage to current converter is further responsive to the noise component of the power signal to produce the current flow between the first power source node and the second power source node of the circuit substantially in phase with the noise component when a frequency value of the noise component reaches a selected value. When the current flows substantially in phase with the noise component, the circuit is capable of providing a substantially resistive load to damp the noise component of the power signal.

In yet another embodiment of the present invention, an electronic device having an integrated circuit and a power source external to the integrated circuit for supplying power thereto on a bus coupling the integrated circuit and the power source, a circuit in the integrated circuit is provided for off setting noise associated with the power source. The circuit includes a current mirror having an input portion and an output portion. The output portion of the current mirror provides a substantially resistive load to offset the noise associated with the power source. A current source drives the input portion of the current mirror. A capacitor coupled between the input portion and the output portion of the current mirror and the bus to form a charged sharing relationship with the output portion of the current mirror. The charge share relationship between the capacitor and the output portion of the current mirror allows a significant portion of the noise component to be coupled to the input of the current mirror output portion. The circuit is also configurable to include a resistor coupled between the input portion and the output portion of the current mirror to prevent the capacitor from charging upon the presence of a sufficient amount of noise on the bus. The circuit offsets the noise associated with the power source when the noise is above a selected frequency value.

BRIEF DESCRIPTION OF THE DRAWINGS

An illustrative embodiment of the present invention will be described below relative to the following drawings.

DETAILED DESCRIPTION

The illustrative embodiment of the present invention provides a circuit having a resistive or approximately resistive function for providing a load to a power source external to an integrated circuit. The resistive function offsets or dampens a noise component of a power signal provided to the integrated circuit by the external power source. In the illustrative embodiment, the circuit is adapted to offset a noise component associated with a power signal from a power source located externally to an integrated circuit when a frequency of the noise component is between a first frequency value and a second frequency value. The circuit is able to minimize a noise component of a power signal without significantly increasing switching time of a gate due to reduced voltage value of the power grid in the integrated circuit. This, in turn, avoids any significant increase in gate switching time due to a voltage reduction on the power grid commonly associated with a resistive load for damping noise associated with a power signal.

In the illustrative embodiment, the circuit is well-suited for use in an integrated circuit coupled to an external power source. The circuit allows an integrated circuit, such as a microprocessor, to minimize a magnitude of a power source noise component up to a frequency limited by on-die electrical conductor physical layout inductances and capacitances.

Figure 1:
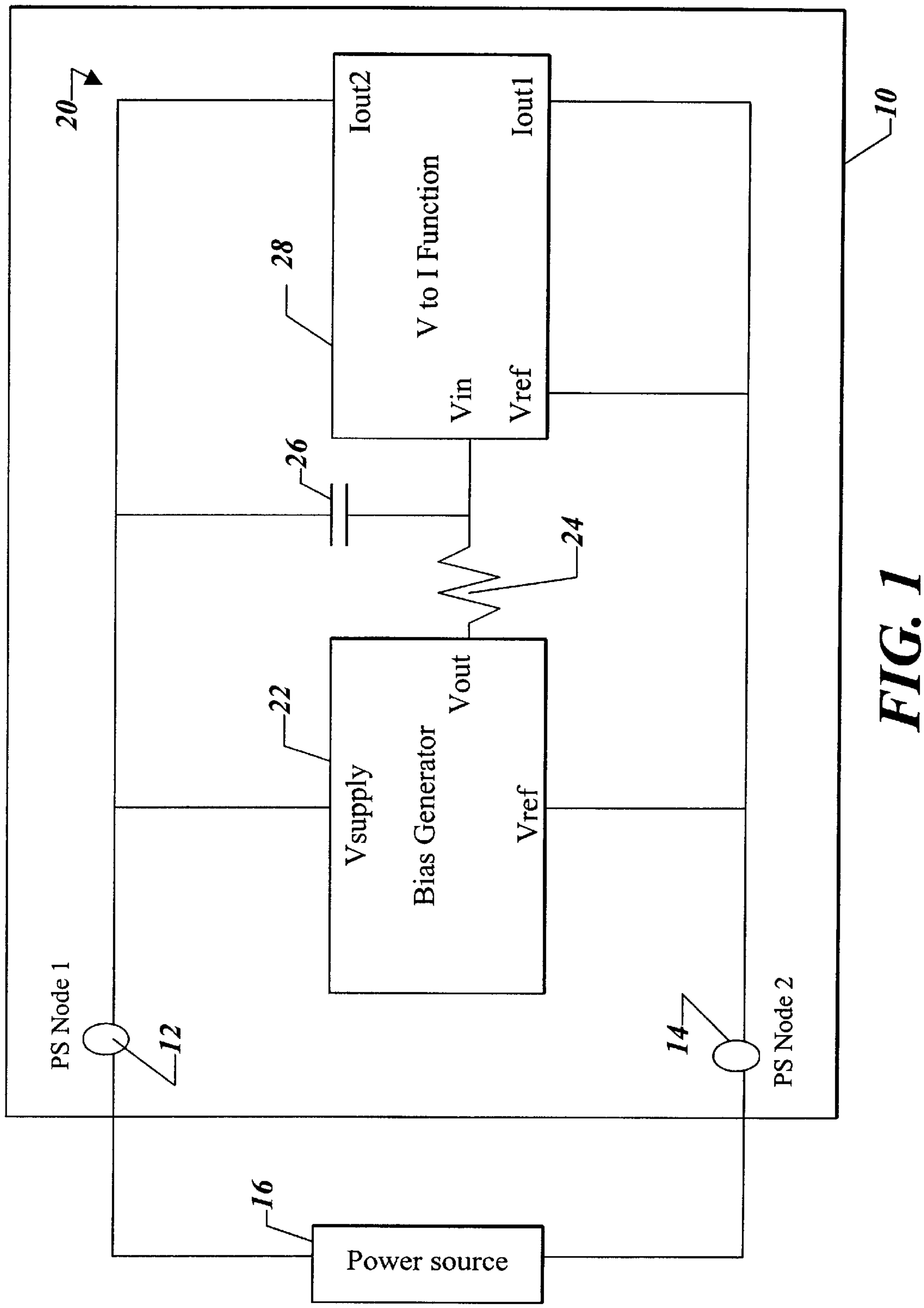
FIG. 1 depicts a block diagram of a circuit suitable for practicing the illustrative embodiment of the present invention.

FIG. 1 is a block diagram of an exemplary integrated circuit 10 that is suitable for practicing the illustrative embodiment of the present invention. The exemplary integrated circuit 10 includes a damping circuit 20 that includes a power source node 12 and a power source node 14 coupled to a power source 16 that is external to the exemplary integrated circuit 10. The power source supplies power to the damping circuit 20 and the exemplary integrated circuit 10. Typically, the external power source and the exemplary integrated circuit 10 are mounted to the same printed wiring board (PWB).

The damping circuit 20 includes a bias generator 22 coupled between the power source node 12 and the power source node 14. The bias generator 22 generates a constant or nearly constant voltage value between a voltage output node $V_{out}$, and a voltage reference node $V_{ref}$ of the bias generator 22. A resistor 24 is coupled to the bias generator 22. The resistor 24 is also coupled to a capacitor 26 and to the voltage input node $V_{in}$ of a voltage to current function generator 28. The capacitor 26 is additionally coupled to power supply node 12, and a second current output node $I_{out2}$ of the voltage to current function generator 28. The voltage to current function generator 28 has a voltage reference node $V_{ref}$ and a first current output node $I_{out1}$ coupled to power source node 14.

The voltage to current function generator 28 produces a current flow between power source node 12 and power source node 14. The value of the current flow produced by the voltage to current function generator 28 is a linear or near linear function of a constant (β) times the expression of the voltage value at the voltage input node $V_{in}$ of the voltage to current function generator 28 minus the voltage value at the voltage reference node $V_{ref}$ of the voltage to current function generator 28, plus or minus an optional constant voltage value. The resistor 24 operates to modulate the voltage value at the voltage input node $V_{in}$ of the voltage to current function generator 28. The capacitor 26 is sized to have a capacitance value that is about between 5 to 10 times greater than a capacitance value associated with the voltage to current function generator 28 to avoid charging and discharging of the capacitor 26 in the presence of noise on the power signal from the power source and to provide an effective charge share capability between the capacitor 26 and the voltage to current function generator 28.

In operation, with the voltage value between the power source node 12 and power source node 14 at a near constant value, the bias generator 22 produces a constant or near constant voltage value between its output voltage node and its voltage reference node. As such, a current flows from the output voltage terminal $V_{out}$ of the bias generator 22 through the resistor 24 and then through the capacitor 26 charging the capacitor 26 until the voltage across the resistor 24 is zero volts and no current is flowing through resistor 24. The voltage across the resistor 24 is the voltage value at the input voltage node $V_{in}$ of the voltage to current function generator 28 relative to the bias generator 22 output voltage terminal $V_{out}$. The current that flows between the first and second current output terminals of the voltage to current function generator 28 is a function of the voltage value at the input voltage node in of the voltage to current function generator 28.

With a steady state voltage between power source node 14 and power source node 12, load current flow between power source node 14 and power source node 12 is steady. This steady state condition or bias steady state condition occurs after a transient settling time period that is approximately equal to the product of the resistance value of resistor 24, and the capacitance value of the capacitor 26, as expressed in equation (1).

$$\tau = RC \tag{1}$$

This operating point or steady state condition is described as the condition that occurs for power source noise or voltage variation frequency below a value that is determined by the inverse of the time period formed by the resistance value of resistor 24, the capacitance value of the capacitor 26, and a constant (2π) as set forth in equation (2).

$$F_1 = \frac{1}{2\pi RC} \tag{2}$$

This first frequency value is described as the low frequency response cutoff of the damping circuit 20.

For power supply noise voltage frequencies that are above the established low frequency response cutoff of the damping circuit 20, the damping circuit 20 functions in the following manner. Within the voltage to current function generator 28, there is a loading capacitance between the input voltage node $V_{in}$ and the reference voltage node $V_{ref}$ that is substantially less than the capacitance of the capacitor 26. As such, the noise component associated with the power source voltage signal is coupled between the capacitor 26 and the input voltage node of the voltage to current function generator 28 at a charge share related amplitude. That is, the input voltage node of the voltage to current function generator 28 receives about over ninety percent of the amplitude value of the noise component when the power supply noise voltage frequency rises above the low frequency cutoff of the damping circuit 20. When the power supply noise voltage frequency rises above the low frequency cutoff of the damping circuit 20, the voltage to current function generator 28 provides a load current flow between power source node 12 and power source node 14 that is in phase with the noise voltage value at the input voltage node $V_{in}$ of the voltage to current function generator 28. As such, the voltage to current function generator 28 provides the electrical equivalent of a resistance that is in series with a voltage source to damp the noise voltage of the voltage signal from the external power source.

The electrical equivalent voltage source value is over approximately 90% of the average power supply voltage (VDD) in the illustrative embodiment. This value is preferably set to not exceed the transient minimum power supply voltage for a desirable tradeoff between of noise reduction and power dissipation. The equivalent voltage source value is a function of the power supply average voltage value minus the product of steady state or DC current from function generator 28 times the electrical equivalent resistance of current function generator 28 at power supply noise frequencies above first cutoff frequency. The equivalent voltage source usage greatly reduces power dissipation when compared to a resistive loading of a power supply to create an arrangement that is equivalent to setting the equivalent voltage source to zero volts. Table I below illustrates the inverse relationship between load power and the electrical equivalent voltage source value, as discussed above.

TABLE I

| Equivalent V-Source % VDD | % of load power |
|---|---|
| 0% | 100% |
| 90% | 10% |
| 95% | 5% |

Consequently, the damping circuit 20 illustrated in FIG. 1 creates a damping resistance in series with an effective, but not actual voltage source to damp a noise component overlaid on a DC power signal. As a result, as the effective voltage of the damping circuit 20 increases, significantly less power is dissipated by the damping circuit 20 when compared to a passive parallel or serial resistive damping network having a similar resistance value.

The damping circuit 20 is able to produce a load current between power source node 12 and power source node 14 that is the sum of a steady state load current or near steady state load current below a low frequency cutoff and a load current above the low frequency cutoff that is in phase with, and increases or decreases in amplitude in a substantially linear fashion with the amplitude of the noise component. As such, the damping circuit 20, at noise frequency values above the low frequency cutoff, lowers an effective impedance for the external power source by providing a resistive or near approximate resistive load.

Moreover, the damping circuit 20 has an effective frequency response upper limit that is significantly greater than the clock frequency of the exemplary integrated circuit 10. Consequently the damping circuit 20 is capable of damping noise components of a power signal having frequency values that are considered above the operating frequency limits of amplifier-based noise reduction techniques. The upper frequency response limit of the damping circuit 20 is a function of the physical dimensions, the conductor layout and conductor electrical characteristics such as resistivity and skin effect of the exemplary integrated circuit 10. This upper operating frequency limit is generally a very high frequency value, such as greater than 10 times the clock frequency of the exemplary integrated circuit 10. Hence, the upper operating frequency limit of the damping circuit 20 does not substantially limit the effectiveness of the loading current produced to damp a noise component of a signal from a power source external to the exemplary integrated circuit 10, as well as a power supply or charge source internal to the exemplary integrated circuit 10 yet distant from on-chip functional circuit loading.

Figure 2:
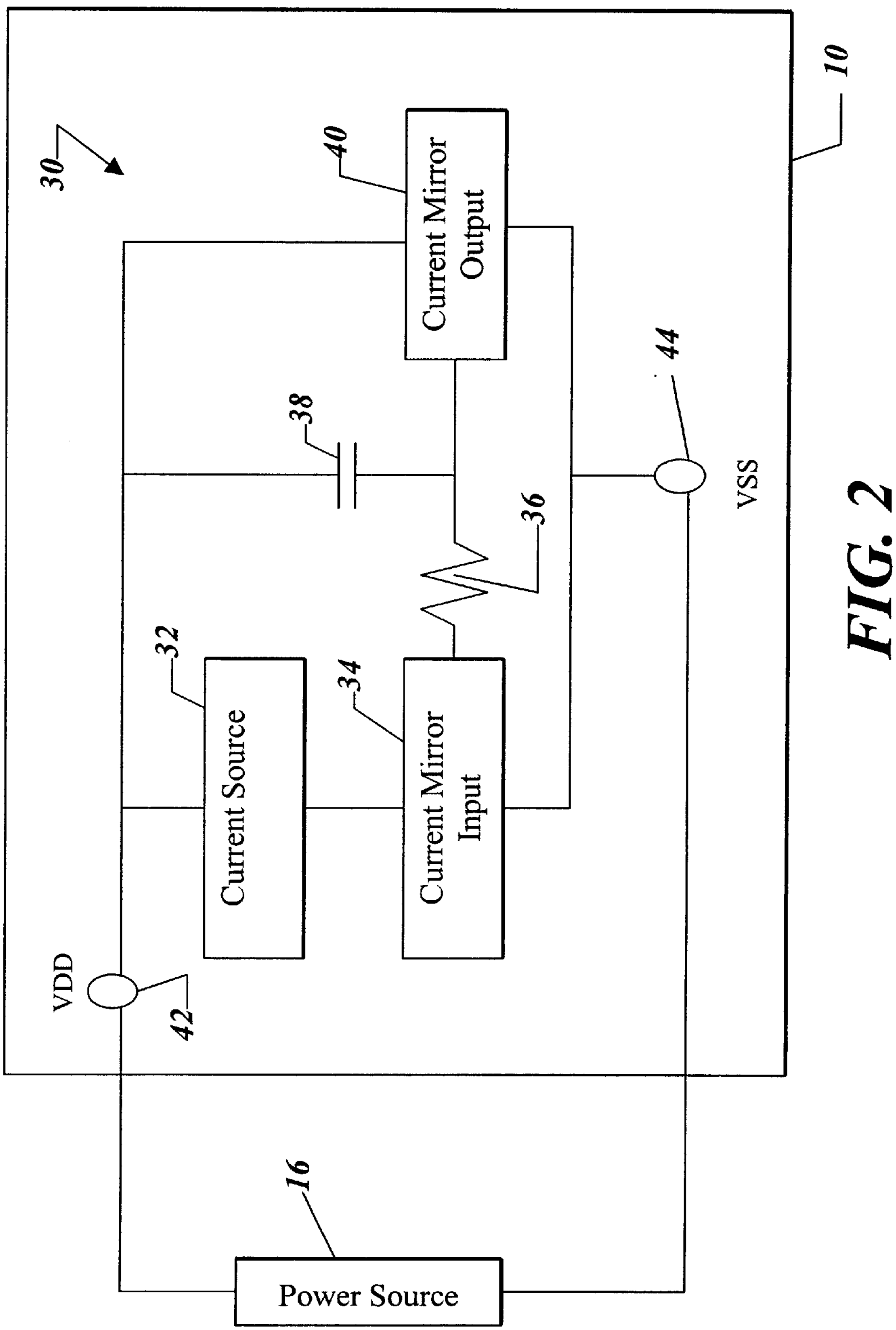
FIG. 2 illustrates a block diagram of a second circuit suitable for practicing the illustrative embodiment of the present invention.

FIG. 2 illustrates an alternative embodiment of the illustrative embodiment as implemented in the exemplary integrated circuit 10. The alternative embodiment is illustrated as a damping circuit 30 having a VDD node 42 and a VSS node 44 that receive a power signal from a power source 16 external to the exemplary integrated circuit 10. The damping circuit 30 is adapted to include a current source 32 coupled to the VDD node 42 and coupled to a current mirror input 34. The current mirror input 34 is coupled to the VSS node 44 and to a resistor 36. The resistor 36 is coupled to a capacitor 38 and an input of a current mirror output 40. The capacitor 38 is also coupled to the VDD node 42. The current mirror output 40 has a first current output terminal coupled to VDD node 42 and a second current output terminal coupled to the VSS node 44 to produce an output load current that flows between the VDD node 42: and the VSS node 44.

The damping circuit 30 operates in similar manner as the damping circuit 20 discussed above relative to FIG. 1. That is, when the voltage signal supplied by the power source external to the exemplary integrated circuit 10 provides a steady state or near steady state voltage signal that is below the low frequency cutoff established by equation (2) discussed above. That is, the inverse of the time constant formed by the capacitor 38, the resistor 36 and the constant 2π, the damping circuit 30 provides a first current component that is in a steady state or near steady state. When the voltage signal supplied by the power source includes voltage variations having a frequency value above the low frequency cutoff of the damping circuit 30, the current mirror output 40 produces a second current component in phase with the voltage variations to provide an effective resistance to damp the amplitude of the voltage variations.

Figure 3:
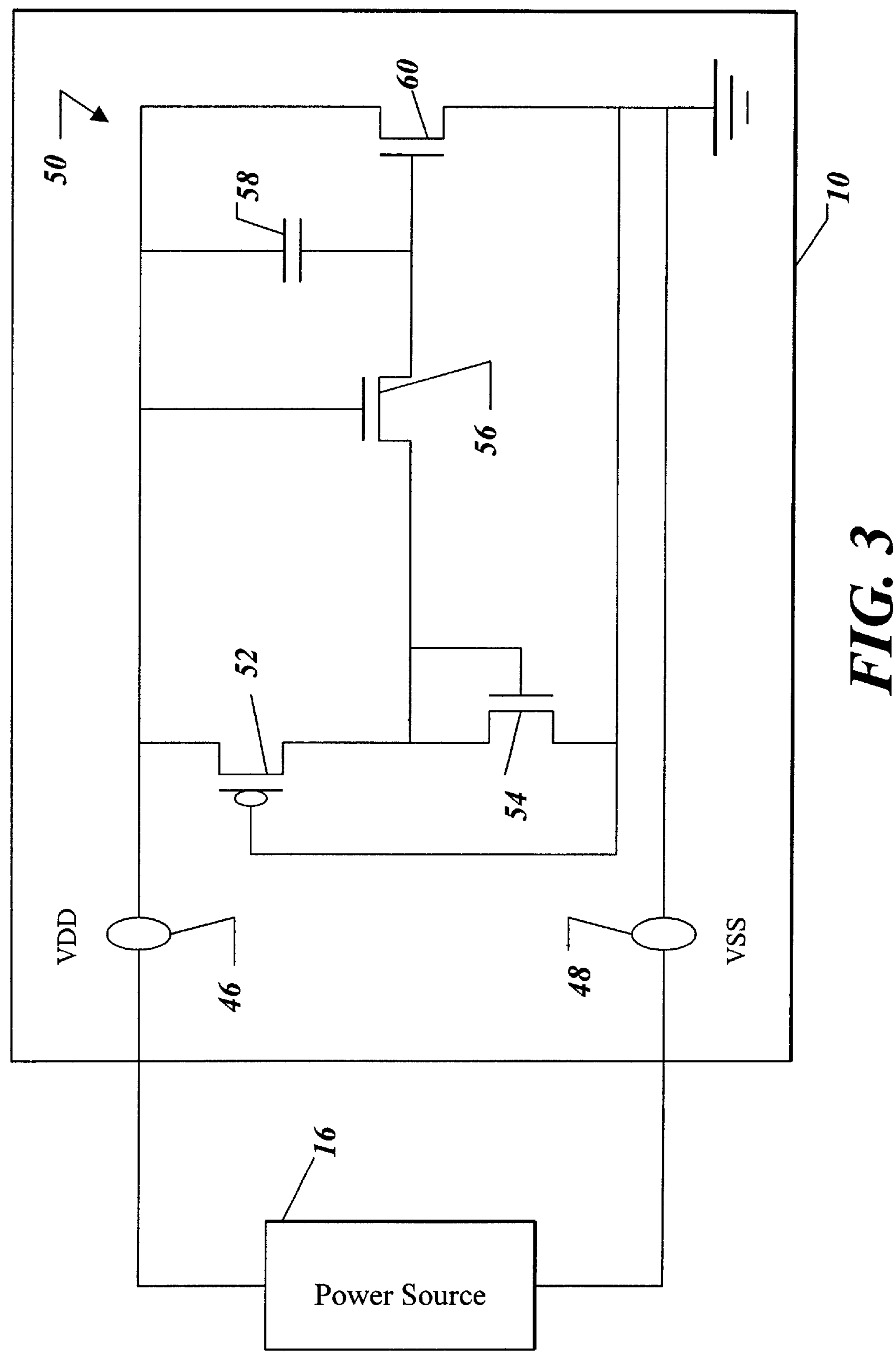
FIG. 3 illustrates a schematic diagram suitable for practicing the illustrative embodiment of the present invention.

FIG. 3 illustrates a further embodiment of the present invention suitable for damping a noise voltage component of a power signal supplied to the exemplary integrated circuit 10 from a power source 16 external to the exemplary integrated circuit 10. A damping circuit 50 is adapted to include a PMOS device 52 having its source coupled to the VDD node 42, its gate coupled to a VSS node 48 and its drain coupled to the drain of NMOS device 54, the gate of NMOS device 54, and the source of NMOS device 56. The source of NMOS device 54 is also coupled to the VSS node 48. The NMOS device 56 has its gate coupled to the VDD node 46 and its drain coupled to the gate of NMOS device 60 and to capacitor 58. The capacitor 58 is also coupled to the VDD node 46. The NMOS device 60 has its drain coupled to the VDD node 46 and its source coupled to the VSS node 48.

The damping circuit 50 operates in similar manner as the damping circuit 20 and the damping circuit 30 discussed above with reference to FIGS. 1 and 2, respectively. That is, the damping circuit 50 produces a first current component below a low frequency cutoff determined by the product of the resistance value of the NMOS transistor 56 and the capacitance value of the capacitor 58 and a constant (2π). Moreover, the damping circuit 50 for the noise component frequency values at or above the low frequency cutoff value produces a load current through NMOS transistor 60 that is in phase with the noise component. The NMOS transistor 60 thus provides a resistive characteristic load to dampen the amplitude of the noise voltage component at frequencies above the low frequency cutoff of the damping circuit 50.

The PMOS transistor 52 operates as a current device that provides a small bias of current. The NMOS transistor 54 is the input device of the current mirror formed by the NMOS transistor 54 and the NMOS transistor 60. The NMOS transistor 54 operates to keep the gate of NMOS transistor 60 constantly biased so that the damping circuit 50 is always working. The current mirror current ratio of the input device the NMOS transistor 54, to the output device, the NMOS transistor 60 is about 1:6 although those skilled in the art will recognize that other current mirror current ratios are suitable for use in the damping circuit 50. Those skilled in the art will recognize that the damping circuit 50 can operate without the NMOS transistor 56, but would suffer from charge pumping of the capacitor 58 due to the non-linear response of NMOS transistor 54, which, in turn, leads to lost output current for the damping circuit 50.

The capacitor 58 has a capacitance value that is about 10 times the capacitance value of the gate to source capacitance value of the NMOS transistor 60. The significantly greater capacitance value of the capacitor 58 provides a charge share ratio of about 90% such that about 90% of the noise component overlying the power signal provided to the VDD node 46 appears between the gate and source of the NMOS transistor 60. The NMOS transistor 60 operates as the output device of the current mirror formed by the NMOS transistor 54 and the NMOS transistor 60 and provides a low resistance value to the VDD node 46 to effectively damp a noise component of a power signal above the low frequency cutoff of the damping circuit 50. The NMOS transistor 60 operates to damp the noise component of the power signal between the low frequency cutoff and the upper frequency cutoff determined by the physical dimensions, the conductor layout and conductor electrical characteristics such as resistivity and skin effect of the exemplary integrated circuit 10.

In one example of the damping circuit 50 discussed above, the PMOS transistor 52 provides about 100 $\mu$A of current, and the NMOS transistor 60 provides about 40 ohms of resistance while being biased below VDD. Those skilled in the art will recognize that these current and voltage values are exemplary and that in other examples of the damping circuit 50, the damping circuit 50 can be configured and operated to provide other current and voltage values suitable for a desired application.

The above described damping circuits 20, 30 and 50 are suitable for use on each output node of the exemplary integrated circuit 10 to damp noise from a power source that is caused by variability in a load current of the exemplary integrated circuit 10. Each of the damping circuits 20, 30 and 50 provides the noise reduction of between about 40 to 80 pF of implemented on-chip VDD to VSS capacitance per output of the exemplary integrated circuit 10 as compared to the conventional capacitance value of between 100 to 120 pF's per output of a conventional integrated circuit. The effective output capacitance is provided to reduce a noise component on a power signal of power grid in the exemplary integrated circuit 10. The 40 to 80 pF effective capacitance value that the damping circuits 20, 30 and 50 provide requires an area about equal to a single capacitor having a capacitance value about 1 pF. Consequently, the reduction in the amount of, and hence the area needed, to implement the power supply stabilizing capacitance provided by the damping circuits 20, 30 and 50 result in a significant space savings in the integrated circuit, which, in turn, allows for placement of additional gates to increase speed or functionality, or both of the exemplary integrated circuit 10. It is typical that the noise component riding on the power signal from the external power source has a value of between 100 and 200 mVs, which, the damping circuits 20, 30 and 50 are able to reduce or damp the noise component to about 50 mV. Those skilled in the art will recognize that the above described voltage and capacitance values will vary based on a variety of factors that include, implementation, configuration, application, and other like factors.

Moreover, the damping circuits 20, 30 and 50 are well suited for use within the core-power section of the exemplary integrated circuit 10 in addition to the periphery power section of the exemplary integrated circuit 10. That is, the damping circuits 20, 30 and 50 are well suited for use in and around a processor section of a microprocessor or other core section of an integrated circuit as well as in an input/output section of the microprocessor or other section of an integrated circuit considered outside of the core section.

Figure 4:
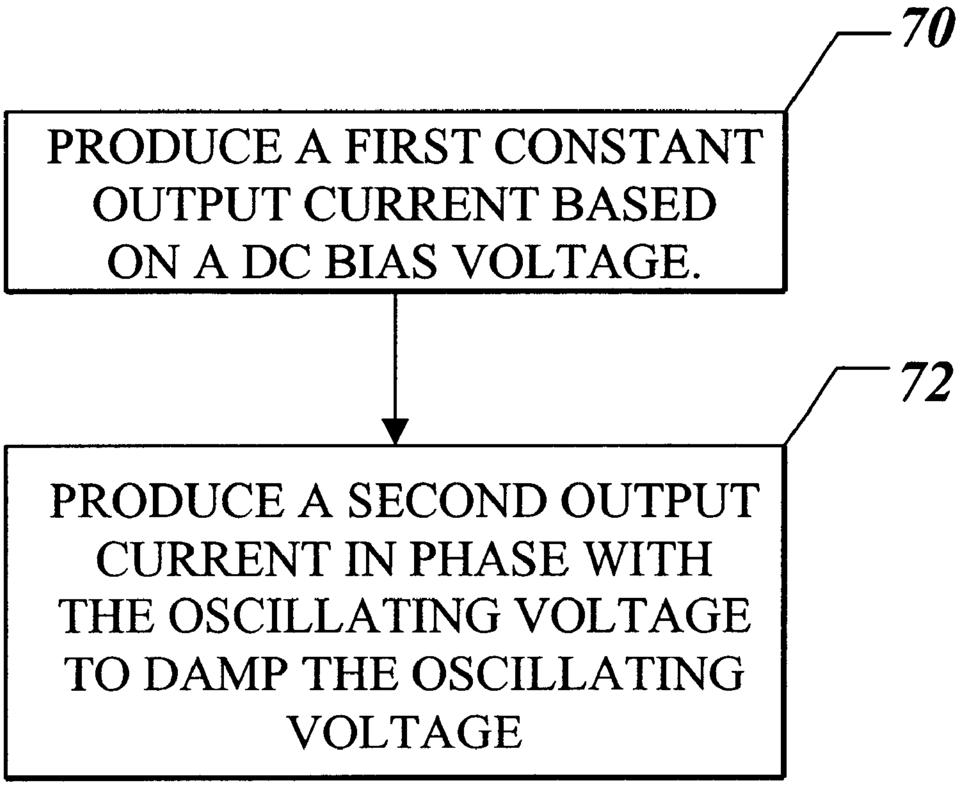
FIG. 4 illustrates a flow diagram that depicts steps taken to perform an illustrative embodiment of the present invention.

FIG. 4 illustrates a flow diagram providing steps to damp a noise component of a power signal in the exemplary integrated circuit 10. By first generating a constant or nearly constant bias voltage (step 70) a constant or near constant output current can be produced based on the DC bias voltage. This output current is unaffected by the noise component of the power signal provided to the DC bias voltage source. Once the frequency value of the noise component of the power signal provided to the exemplary integrated circuit 10 exceeds a threshold value, a second current component is produced that is in phase with the oscillating frequency of the noise component (step 72). The second current component flowing in phase with the noise component operates to lower an effective impedance of the exemplary integrated circuit 10 as seen by, the power source, which damps the amplitude of the noise component riding on the power signal.

While the present invention has been described with reference to a preferred embodiment thereof, one skilled in the art will appreciate various changes in form and detail may be made without departing from the intended scope of the present invention as defined in the pending claims. For example, the PMOS transistor 52 of the damping circuit 50 can be substituted with a more precise current source circuit tailored to power supply noise reduction and other needs.

What is claimed is:

1. An integrated circuit comprising:

a damping circuit capable of providing a first current component at an output of the damping circuit when a frequency value of a noise component of a power signal from a source of power is about equal to or less than a first cutoff frequency, and said damping circuit capable of providing a second current component at the output of the damping circuit when the frequency value of the noise component of the power signals is above the first cutoff frequency, the second current component having a frequency value that allows the second current component to flow substantially in phase with the noise component of the power signal to damp the noise component of the power signal on a power grid of said integrated circuit wherein, the second current component flows substantially in phase with the noise component of the power signal to about a second cutoff frequency of the damping circuit.

2. The integrated circuit of claim 1, wherein the second current component operates to lower an effective impedance value for the power grid of the integrated circuit.

3. The integrated circuit of claim 1, wherein the first current component provided by the damping circuit has a amplitude value that is substantially constant when said frequency value of the noise component is below the first cutoff frequency.

4. The integrated circuit of claim 1, wherein the damping circuit provides a load current flowing between a first node and a second node of the power grid that is about equal to a sum of the first current component and the second current component when the frequency value of the noise component of the power signal is about above the first cutoff frequency of the damping circuit.

5. The integrated circuit of claim 1, wherein the damping circuit comprises, a first stage having a first input node and a second input node, said first stage producing a substantially constant output voltage value between an output node and a reference node below said first cutoff frequency;

a second stage coupled to the output node of the first stage, wherein the second stage forms a transient circuit that defines a value for the first cutoff frequency; and a third stage coupled to the second stage to produce an output signal of the damping circuit having a current value, the current value of the output signal having a substantially linear relationship to a product of a constant times a difference between a first voltage value on a voltage input node of the third stage and a second voltage value on a voltage reference node of the third stage.

6. The integrated circuit of claim 5, wherein the output signal of the third stage further includes a substantially constant voltage bias value wherein, the bias value is based on a first voltage value on the voltage input node of the third stage and a second voltage value on the voltage reference node of the third stage.

7. The integrated circuit of claim 1, wherein the second cutoff frequency is controlled by an inductance value and a capacitance value associated with a physical layout of on-die conductors in the integrated circuit.

8. The integrated circuit of claim 1, wherein the second cutoff frequency has a frequency value of about ten times a frequency value of a clock signal in the integrated circuit.

9. A method for offsetting a noise component of a power supply output signal received by an integrated circuit, the method comprising the steps of:

producing a first current signal having a first amplitude value in the integrated circuit when the noise component of the power supply output signal is below a selected frequency value; and producing a second current signal having a frequency value in the integrated circuit when the noise component of the power supply output signal is at or above the selected frequency value, wherein the frequency value of the second current signal substantially matches a frequency value of the noise component to flow in phase with the noise component of the power supply output signal to offset the noise component of the power supply output signal by lowering an effective impedance of the integrated circuit for the power supply.

10. The method of claim 9, further comprising the step of, generating a voltage signal to drive a voltage to current converter element to produce said first current signal and said second current signal.

11. The method of claim 9, wherein the step of producing the second current signal in the integrated circuit comprises the step of, summing said first current signal and a current signal responsive to said noise component above said selected frequency value to produce said second current flow.

12. The method of claim 9, wherein the second current signal has an upper frequency limit determined by a capacitance value and an inductance value associated with physical layout of on-die conductors in the integrated circuit.

13. A circuit for providing a substantially resistive load to damp an oscillating noise component of a power signal from a power source external to said circuit, said circuit comprising, a bias voltage generator to generate a bias voltage representative of a voltage value between a first power source node and a second power source node of said circuit;

a voltage to current converter responsive to the bias voltage generated by the bias voltage generator, for producing a current flow between the first power source node and the second power source node of said circuit in response to said bias voltage and said current flow having a frequency value, wherein the voltage to current converter is further responsive to the noise component of the power signal to produce the current flow between the first power source node and the second power source node of said circuit substantially in phase with the noise component of the power signal when the frequency value of the noise component reaches a selected frequency value; and, a resistor and a capacitor coupling the bias voltage generator and the voltage to current converter, the resistor and the capacitor defining said selected frequency value, whereby when the current flow is substantially in phase with the noise component, said circuit is capable of providing said substantially resistive load to damp the noise component of the power signal from the power source external to said circuit.

14. The circuit of claim 13, wherein a portion of the voltage to current converter operates as the substantially resistive load to damp the noise component of the power signal from the power source from between about said selected frequency value and about a cutoff frequency determined by said circuit.

15. The circuit of claim 14, wherein the resistor comprises a MOSFET transistor.

16. The circuit of claim 14, wherein the capacitor comprises a MOSFET transistor.

17. In an electronic device having an integrated circuit and a power source external to said integrated circuit for supplying power thereto on a bus coupling said integrated circuit and said power source, a circuit in said integrated circuit is provided for offsetting noise associated with said power source, said circuit comprising, a current mirror having an input portion and an output portion, the output portion of the current mirror providing a substantially resistive load to offset the noise associated with said power source;

a current source to drive the input portion of the current mirror; and a capacitor coupled between the input portion and the output portion of the current mirror and the bus, the capacitor forming a charge share relationship with the output portion of the current mirror.

18. The circuit of claim 17, further comprising a resistor coupled between the input portion and the output portion of the current mirror.

19. The circuit of claim 18, wherein the resistor comprises a MOSFET transistor.

20. The circuit of claim 17, wherein the capacitor comprises a MOSFET transistor.

21. The circuit of claim 17, wherein the current source comprises a MOSFET transistor.

22. The circuit of claim 21, wherein the MOSFET transistor comprises a P-channel MOSFET.

23. The circuit of claim 17, wherein said circuit offsets said noise associated with said power source when said noise is above a selected frequency value.

* * * * *